United States Patent [19]
Neukermans

[11] Patent Number: 6,153,966
[45] Date of Patent: Nov. 28, 2000

[54] BIOCOMPATIBLE, IMPLANTABLE HEARING AID MICROACTUATOR

[76] Inventor: Armand P. Neukermans, 3510 Arbutus Ave., Palo Alto, Calif. 94303

[21] Appl. No.: 09/406,678

[22] Filed: Sep. 27, 1999

Related U.S. Application Data

[62] Division of application No. 08/896,969, Jul. 18, 1997, Pat. No. 5,977,689.
[60] Provisional application No. 60/022,182, Jul. 19, 1996.

[51] Int. Cl.[7] .................................................. H01L 41/08
[52] U.S. Cl. ............................................ 310/328; 310/363
[58] Field of Search .................................. 310/324, 328, 310/399, 363

[56] References Cited

U.S. PATENT DOCUMENTS

| | | | |
|---|---|---|---|
| Re. 31,031 | 9/1982 | Kissiah, Jr. ....................... | 179/107 R |
| 3,304,446 | 2/1967 | Martinek et al. ..................... | 310/328 |
| 3,346,704 | 10/1967 | Mahoney ............................ | 179/107 |
| 3,557,775 | 1/1971 | Mahoney ............................ | 179/107 |
| 3,594,514 | 7/1971 | Wingrove ......................... | 179/107 R |
| 3,712,962 | 1/1973 | Epley ............................. | 179/107 R |
| 3,764,748 | 10/1973 | Branch et al. .................... | 179/107 E |
| 3,870,832 | 3/1975 | Fredrickson ...................... | 179/107 E |
| 3,882,285 | 5/1975 | Nunley et al. ..................... | 179/107 E |
| 4,069,400 | 1/1978 | Johanson et al. .................. | 179/107 E |
| 4,078,160 | 3/1978 | Bost .............................. | 179/110 A |
| 4,133,984 | 1/1979 | Akiyama .......................... | 179/107 E |
| 4,342,936 | 8/1982 | Marcus et al. ...................... | 310/330 |
| 4,367,426 | 1/1983 | Kimada et al. ..................... | 310/358 |
| 4,383,196 | 5/1983 | Perduijn et al. .................... | 310/358 |
| 4,419,495 | 12/1983 | Hockmair et al. .................. | 128/419 R |
| 4,498,461 | 2/1985 | Hakansson ......................... | 128/1 R |
| 4,592,370 | 6/1986 | Lee et al. ......................... | 128/746 |
| 4,606,329 | 8/1986 | Hough ............................. | 128/1 R |
| 4,617,913 | 10/1986 | Eddington ......................... | 128/1 R |
| 4,726,099 | 2/1988 | Card et al. ........................ | 29/25.35 |
| 4,729,366 | 3/1988 | Schaefer ........................... | 128/1.6 |
| 4,756,312 | 7/1988 | Epley ............................. | 128/420.5 |

(List continued on next page.)

FOREIGN PATENT DOCUMENTS

| | | | |
|---|---|---|---|
| 0242038 | 10/1977 | European Pat. Off. ........ | H04R 25/02 |
| 0076069 | 4/1983 | European Pat. Off. ........ | A61F 11/04 |
| 0259906 | 3/1988 | European Pat. Off. ........ | A61F 02/02 |
| 0263254 | 4/1988 | European Pat. Off. ........ | A61F 11/04 |
| 0563767 | 10/1993 | European Pat. Off. ........ | A61F 02/18 |

(List continued on next page.)

OTHER PUBLICATIONS

Laser in Revision Stapes Surgery, S. George Lesinski, M.D., Janet A. Stein, Head and Neck Surgery, vol. 3, No. 1 (Mar.) 1992, pp. 21–31.
History of Implantable Hearing Aid Development: Review and Analysis, John M. Epley, edited by I. Kaufman Arenberg, Kugler Publications, Aug. 1990; pp. 501–511.
Implantable Hearing Aid, Arch Otolaryngol Head and Neck Surgery—vol. 113, Aug. 1987; Yamigihara et al.; pp. 869–872.

(List continued on next page.)

Primary Examiner—Thomas M. Dougherty
Attorney, Agent, or Firm—Donald E. Schreiber, Esq

[57] ABSTRACT

A biocompatible, implantable microactuator (82) for a fully implantable hearing aid system includes a hollow body (84) that has an open first end (88) and, open first and second faces (94a and 94b). Flexible diaphragms (92, 96a and 96b), respectively covering the end (88) and faces (94a and 94b), hermetically seal the body (84). An incompressible liquid (98) fills the body (84). Transducers (102), provided by laminated, stress-biased unimorphs (32 or 62) that are mechanically coupled to the flexible diaphragms (96a and 96b), deflect the diaphragms (96a and 96b) in response to an electrical driving signal. Deflections of the diaphragms (96a and 96b) are coupled by the liquid (98) to the first flexible diaphragm (92). The unimorphs (32 or 62) include a layer of biocompatible metal (36 or 66–68) deposited on one side of a biocompatible piezoelectric ceramic plate (34 or 64) to stress-bias the plate (34 or 64). A thin, biocompatible electrode (44 or 72) coats the other side of the plate (34 or 64).

13 Claims, 3 Drawing Sheets

U.S. PATENT DOCUMENTS

| | | | |
|---|---|---|---|
| 4,817,607 | 4/1989 | Tatge | 128/419 R |
| 4,817,609 | 4/1989 | Perkins et al. | 128/420.6 |
| 4,850,962 | 7/1989 | Schaefer | 600/25 |
| 4,908,509 | 3/1990 | Senturia | 356/373 |
| 4,928,264 | 5/1990 | Kahn | 367/141 |
| 4,932,405 | 6/1990 | Peeters et al. | 128/419 |
| 4,943,750 | 7/1990 | Howe et al. | 310/309 |
| 4,957,478 | 9/1990 | Maniglia | 600/25 |
| 4,985,926 | 1/1991 | Foster | 381/77 |
| 4,988,333 | 1/1991 | Engebretson et al. | 600/25 |
| 4,999,819 | 3/1991 | Newnham et al. | 367/157 |
| 5,015,224 | 5/1991 | Maniglia | 600/25 |
| 5,015,225 | 5/1991 | Hough et al. | 600/25 |
| 5,033,999 | 7/1991 | Mersky | 600/25 |
| 5,061,282 | 10/1991 | Jacobs | 623/10 |
| 5,070,535 | 12/1991 | Hochmair et al. | 455/41 |
| 5,085,628 | 2/1992 | Engebretson et al. | 600/25 |
| 5,091,820 | 2/1992 | Iwaya et al. | 361/304 |
| 5,095,904 | 3/1992 | Seligman et al. | 128/420.6 |
| 5,176,620 | 1/1993 | Gilman | 600/25 |
| 5,180,391 | 1/1993 | Beoni | 623/10 |
| 5,191,559 | 3/1993 | Kahn et al. | 367/157 |
| 5,271,397 | 12/1993 | Seligman et al. | 607/137 |
| 5,276,657 | 1/1994 | Newnham et al. | 367/157 |
| 5,277,694 | 1/1994 | Leysieffer et al. | 600/25 |
| 5,282,858 | 2/1994 | Bisch et al. | 623/10 |
| 5,306,299 | 4/1994 | Applebaum | 623/10 |
| 5,318,502 | 6/1994 | Gilman | 600/25 |
| 5,338,287 | 8/1994 | Miller et al. | 600/25 |
| 5,344,387 | 9/1994 | Lupin | 600/25 |
| 5,376,857 | 12/1994 | Takeuchi et al. | 310/328 |
| 5,408,534 | 4/1995 | Lenzini et al. | 381/191 |
| 5,411,467 | 5/1995 | Hortmann et al. | 600/25 |
| 5,456,654 | 10/1995 | Ball | 600/25 |
| 5,471,721 | 12/1995 | Haertling | 29/25.35 |
| 5,481,152 | 1/1996 | Buschulte | 310/328 |
| 5,498,226 | 3/1996 | Lenkauskas | 600/25 |
| 5,531,787 | 7/1996 | Lesinski et al. | 623/10 |
| 5,554,096 | 9/1996 | Ball | 600/25 |
| 5,632,841 | 5/1997 | Hellbaum et al. | 156/245 |
| 5,833,626 | 11/1998 | Leysieffer | 600/559 |

FOREIGN PATENT DOCUMENTS

| | | | |
|---|---|---|---|
| 2688132 | of 1993 | France | A61F 02/18 |
| 2825233 | 1/1979 | Germany | H04R 25/02 |
| 3617118 | 8/1989 | Germany | H04R 25/00 |
| 3918086 | 9/1990 | Germany | H04R 25/02 |
| 1551371 | 3/1990 | U.S.S.R. | A61F 02/18 |
| 1440724 | 6/1976 | United Kingdom | H04R 25/02 |
| 2176078 | 4/1986 | United Kingdom | H04R 25/00 |
| 2188290 | 5/1986 | United Kingdom | H04R 25/00 |
| 9000040 | 1/1990 | WIPO | A61F 11/04 |
| 9007915 | 7/1990 | WIPO | A61F 02/18 |

OTHER PUBLICATIONS

Implantable Hearing Devices—State of the Art, Anthony J. Maniglia, M. D., Otolaryngologic Clinics of North America, vol. 22, No. 1, Feb. 1989, pp. 175–200.

Laser for Otosclerosis—Which One If Any and Why, S. George Lesinski, M. D. Lasers in Surgery and Medicine 10:448–457 May 22, 1990.

Current status of Electromagnetic Implantable Hearing Aids, Richard L. Goode,M.D. Otolaryngologic Clinics of North America, vol. 22, No. 1, Feb. 1989, pp. 201–209.

Microfabrication Techniques for Integrated Sensors and Microsystems, K.D. Wise, et al., Science, vol. 254, Nov., 1991, pp. 1335–1341.

Lasers for Otosclerosis, S. George Lesinski, M.D., The Laryngoscope, Supplement No. 46, Jun. 1989, vol. 99, No. 6, Part 2, pp. 1–24.

Homograft Tympanoplasty in Perspective, A Long–Term Clinical study of Formalin Fixed Tympanic Membranes Used For The Reconstruction of 125 Severely Damaged Middle Ears, S. George Lesinski, M.D., The Laryngoscope, Supp. No. 32—vol. 93, No. 11, Part 2, Nov. 1983, pp. 1–37.

Hemograft (Allograft) Tympanoplasty Update, S. George Lesinski, M.D., Laryngoscope, vol. 96, No. 11, Nov. 1986; pp. 1211–1220.

Resonstruction of Hearing When Malleus is Absent: Torp vs. Homograft TMMI.*, Reprint from Laryngoscope, Lesinski, vol. 94, No. 11, Nov. 1984; pp. 1443–1446.

"How I Do It"—Otology and Neurotology, Laryngoscope 93: Plester et al. Jun. 1983, pp. 824–825.

Hearing Aids: A historical and Technical Review, W. F. Carver, Ph.D., Jack Katz, Ph.D., Handbook of Clinical audiology, pp. 565–576, Dec. 1972.

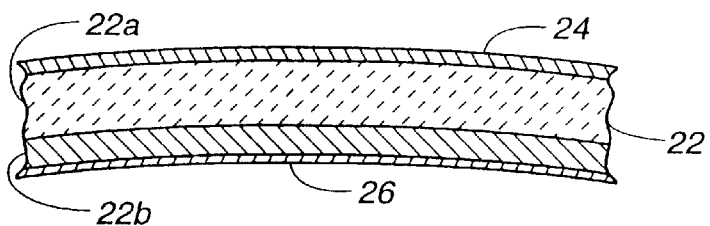
FIG._1
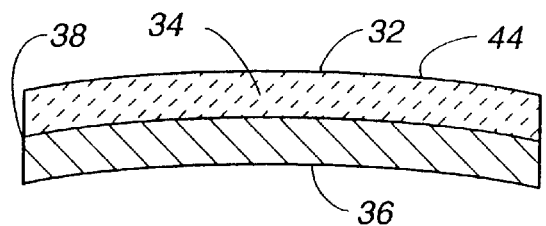
FIG._2
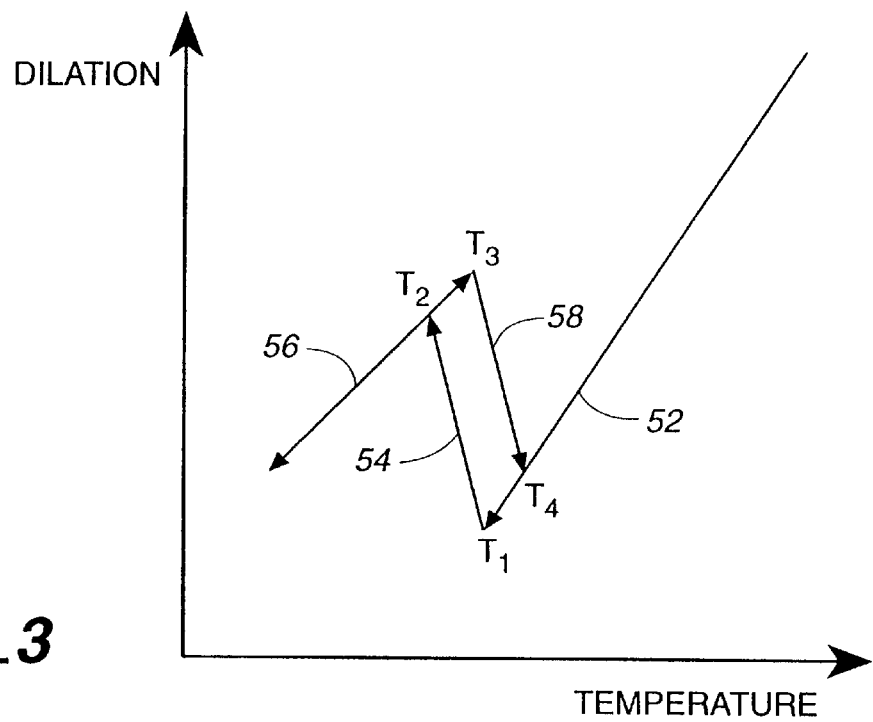
FIG._3

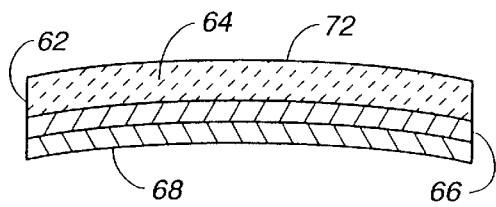
FIG._4
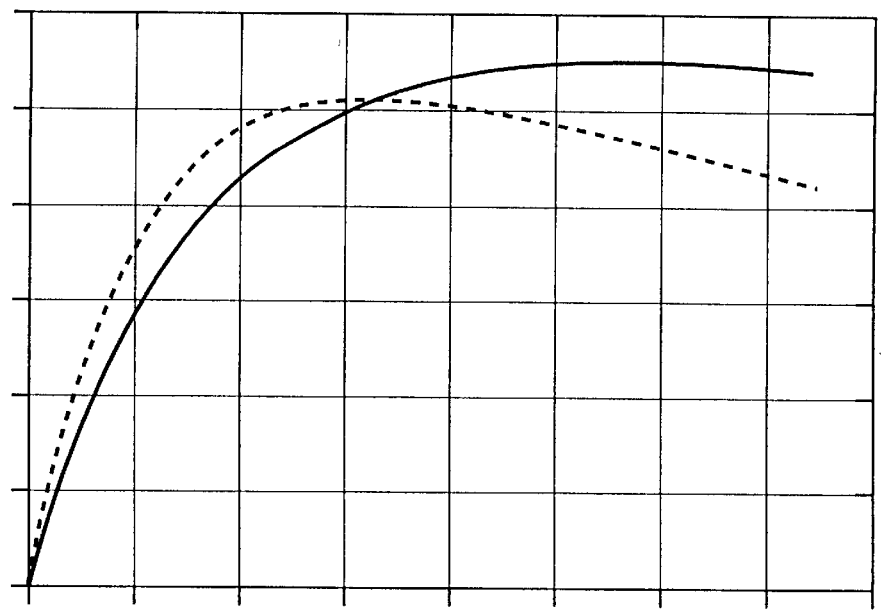
FIG._5   METAL THICKNESS
DEFLECTION PER VOLT

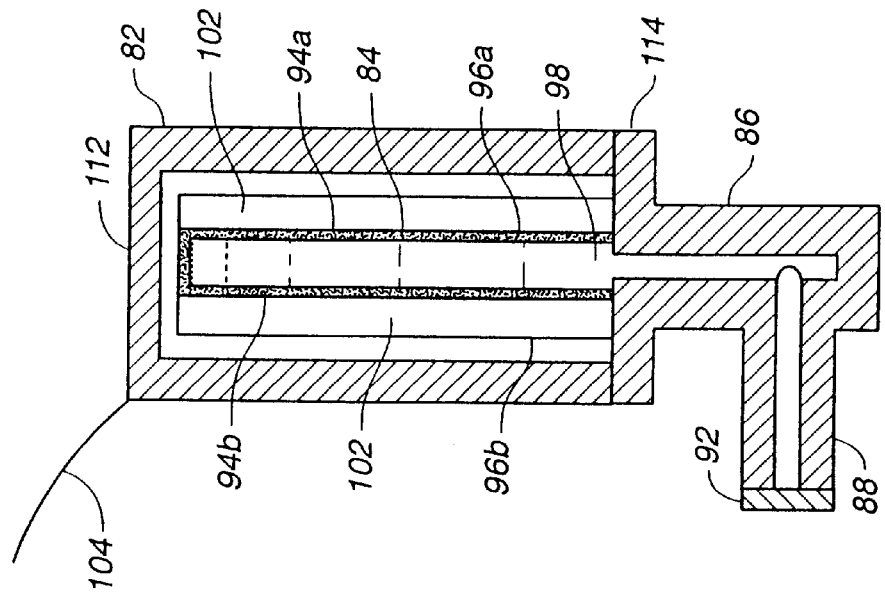
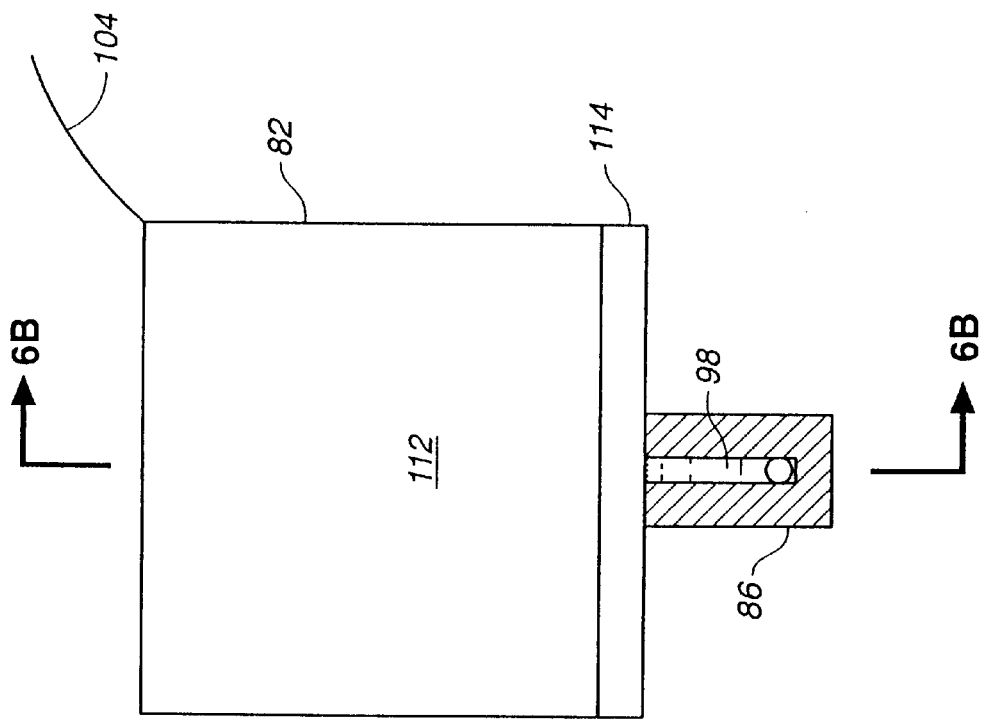

BIOCOMPATIBLE, IMPLANTABLE HEARING AID MICROACTUATOR

This is a division of application Ser. No. 08/896,969 now U.S. Pat. No. 5,977,689 filed Jul. 18, 1997, that also claims the benefit of U.S. Provisional Patent Application Ser. No. 60/022,182 filed on Jul. 19, 1996.

BACKGROUND OF THE INVENTION

1. Field of the Invention

The present invention relates to the field of implantable biocompatible transducers, particularly those useful for a microactuator included in a fully implantable hearing aid system.

2. Description of the Prior Art

Patent Cooperation Treaty ("PCT") patent application Ser. No. PCT/US96/15087 filed Sep. 19, 1996, entitled "Implantable Hearing Aid" ("the 15087 PCT Patent Application") describes an implantable hearing aid system which uses a tiny implantable microactuator. A PCT patent application Ser. No. PCT/US97/02323 entitled "Improved Biocompatible Transducers" filed Feb. 14, 1997, ("the 02323 PCT Patent Application") discloses improved implantable microactuators that are useful in the fully implantable hearing aid system disclosed in the 15087 PCT Patent Application. The fully implantable hearing aid system disclosed in the 15087 and 02323 PCT Patent Applications can operate for a period of five years on a set of batteries, and produce sound levels of 110 dB. The fully implantable hearing aid system described in these PCT Patent Applications is extremely compact, sturdy, rugged, and provides significant progress towards addressing problems with presently available hearing aids.

As described in the 15087 PCT Patent Application, the microactuator is preferably implanted into a fenestration that pierces the promontory of the cochlea, and uses stress-biased lead lanthanum zirconia titanate ("PLZT") transducer material. Stress-biased PLZT materials exhibit very high deflections and generate very high forces in comparison with other existing piezoelectric materials and/or structures. Such materials provide in a monolithic structure both a layer of conventional PLZT and a compositionally reduced layer from which the PLZT oxide has been converted to an electrically conductive Crete material. During operation of the transducer, the PLZT layer expands and contracts laterally upon application of an alternating current ("AC") voltage across the disk. Expansion and contraction of the PLZT layer flexes the disk back-and-forth due to differential expansion between the PLZT layer and the unexpanding Crete layer. However, the Crete layer in that transducer material includes a metallic form of lead ("Pb") as one of its constituent elements.

Microactuators disclosed in the 15087 PCT Patent Application include a membrane diaphragm that provides good biological isolation for the transducer. Moreover, use of the membrane diaphragm fully preserves, or may, through the use of hydraulic amplification, actually enhance transducer performance by magnifying the transducer's deflection or displacement. Although the transducers disclosed in the 15087 PCT Patent Application usually attach the Crete layer to the membrane diaphragm and fully enclose that layer, a possibility still exists that lead may leach from the transducer.

SUMMARY OF THE INVENTION

An object of the present invention is to provide a fully biocompatible transducer.

Another object of the present invention is to provide a fully biocompatible transducer that is suitable for use in a microactuator included in an implantable hearing aid system.

Another object of the present invention is to provide an transducer for a microactuator that is fabricated from only biocompatible materials.

Yet another object of the present invention is to provide a transducer for a microactuator that is non-toxic.

Briefly, the present invention is a biocompatible, implantable microactuator adapted for inclusion in a fully implantable hearing aid system. The microactuator includes a hollow body having an open first end and, in a preferred embodiment, open first and second faces that are separated from the first end. The microactuator includes a first flexible diaphragm that seals the body's first end, and that is adapted for deflecting outward from and inward toward the body. A second flexible diaphragm seals across the body's first face, and a third flexible diaphragm seals across the body's second face thereby hermetically sealing the body. An incompressible liquid fills the hermetically sealed body.

In a preferred embodiment first and second biocompatible, unimorphs are mechanically coupled to and an integral part of respectively the second and third flexible diaphragms. The first and second unimorphs are adapted for receiving an electrical driving signal upon the application of which the first and second unimorphs directly deflect respectively the second and third flexible diaphragms. Deflections of the second and third flexible diaphragms are coupled by the liquid within the body to the first flexible diaphragm.

Both the first and second unimorph include a plate of biocompatible piezoelectric material, preferably a lead zirconia titanate ("PZT") or PLZT material, to which is bonded a layer of biocompatible metal, preferably titanium, nickel, platinum, rhodium, palladium, gold, or a shape memory alloy such as nickel-titanium Naval Ordinance Laboratory ("Nitinol"). The layer of biocompatible metal may be processed to apply a stress-bias to the plate of biocompatible piezoelectric material. The first and second unimorphs also include a thin, biocompatible electrode applied to each of the plates of biocompatible piezoelectric material opposite the respective layers of biocompatible metal. Application of the electrical driving signal across the layer of biocompatible metal and the biocompatible electrode causes both of the unimorphs to deflect. To effect a stress-bias of the unimorphs, the unimorphs are annealed at a high temperature such as 500° C. to relieve all uncontrolled stress, and, in the instance of the shape memory alloy Nitinol, to establish a hard austenitic phase of the material. Cooling the unimorphs from the elevated temperature applies the requisite stress-bias to the unimorph.

These and other features, objects and advantages will be understood or apparent to those of ordinary skill in the art from the following detailed description of the preferred embodiment as illustrated in the various drawing figures.

BRIEF DESCRIPTION OF THE DRAWINGS

FIG. 1 is a cross-sectional view illustrating a stress-biased PLZT transducer in accordance with the 15087 PCT Patent Application;

FIG. 2 is a cross-sectional view illustrating a stress-biased unimorph transducer in accordance with the present invention that has improved biocompatibility;

FIG. 3 is a phase diagram for a shape memory Nitinol alloy;

FIG. 4 is a cross-sectional view illustrating a stress-biased unimorph transducer in accordance with the present invention that has improved biocompatibility;

FIG. 5 is a graph depicting deflection sensitivity of a stress-biased unimorph transducer, such as those depicted in FIGS. 2 and 4, for various thicknesses of a metal layer that is bonded to a piezoelectric plate;

FIG. 6A is a partially sectioned elevational view of a microactuator for a fully implantable hearing aid system; and FIG. 6B is a cross-sectional elevational view of the microactuator taken along the line 6B—6B in FIG. 6A.

DETAILED DESCRIPTION OF THE PREFERRED EMBODIMENT

FIG. 1 is a cross-sectional elevational view depicting a transducer 22 as disclosed in the 15087 PCT Patent Application. The 15087 PCT Patent Application discloses that the transducer 22 is preferably fabricated from a thin circular disk of stress-biased PLZT material. This material may be one of the materials manufactured by Aura Ceramics and sold under the "Rainbow" product designation. These PLZT unimorphs provide a monolithic structure one side of which is a layer 22a of conventional PLZT material. The other side of the PLZT unimorph is a compositionally reduced layer formed by chemically reducing the oxides in the native PLZT material to produce a conductive Crete layer 22b. The conductive cermet layer 22b typically comprises about 30% of the total disk thickness, and typically may have a composition that contains up to 60% lead. Removing of the oxide from one side of the unimorph shrinks the conductive Crete layer 22b which bends the whole disk and puts the PLZT layer 22a under compression. The PLZT layer 22a is therefore convex while the conductive Crete layer 22b is concave.

For use in the fully implantable hearing aid system, as depicted in FIG. 1 the PLZT layer 22a and the conductive Crete layer 22b are respectively overcoated with thin metal layers to provide a PLZT electrode 24 and a Crete electrode 26. The electrodes 24 and 26 may be applied to the transducer 22 in various different ways such as plating, evaporation, metal spraying etc. Application of a voltage across the electrodes 24 and 26 causes the disk to become either more or less bowed, depending upon the polarity of the applied potential.

Although in the fully implantable hearing aid system's microactuator disclosed in the 15087 PCT Patent Applications the transducer 22 does not contact a subject's body, and may be hermetically sealed within the microactuator, some of the properties of the metallic form of lead in the conductive Crete layer 22b may be undesirable.

FIG. 2 illustrates an alternative structure for the transducer first proposed in the 15087 PCT Patent Application that eliminates the metallic form of lead containing Crete conductive Crete layer 22b. In FIG. 2, a metal laminated unimorph 32 consists of a plate 34 of biocompatible piezoelectric material, such as a biocompatible PLZT or biocompatible PZT, onto which is deposited a conductive metallic layer 36. For biocompatible PLZT and PZT materials, lead occurs in an oxide form which appears to be non-toxic.

The 15087 PCT Patent Application discloses that in fabricating the laminated unimorph 32 for the fully implantable hearing aid system the piezoelectric plate 34 is lapped down to a thickness from 1.0 to 6.0 mils, and then coated with a thin chromium layer 38 onto which is plated a thin nickel layer 36. The thin nickel layer 36 stresses the piezoelectric plate 34 thereby mimicking the stress-bias of the conductive Crete layer 22b in the PLZT unimorph transducer 22. A thin, biocompatible metal electrode 44 is applied to the plate 34 opposite the layer 36. In practice it has been found that the stress applied with a plated nickel layer 36 is usually low, and that it is difficult to control the stress-bias because of the changing parameters in the plating bath.

The 15087 PCT Patent Application also proposes that a metal laminated unimorph 32 may be fabricated by applying a thin layer 36 of a shape memory alloy, such as 5 to 20 microns of Nitinol, nickel-titanium-copper, or copper-zinc-aluminum, to the piezoelectric plate 34. After a layer 36 of such material has been applied to the piezoelectric plate 34, heating or cooling the shape memory alloy establishes a phase in which the alloy layer 36 applies compressive or tensile stress to the plate 34. As is apparent to those skilled in the art of shape memory alloys, hysteresis in a phase transition of the alloy maintains that stress upon removal of the heating or cooling. However, it has been determined experimentally that applying a shape memory alloy layer 36 to the plate 34 as described without a careful thermal procedure does not necessarily yield a satisfactory structure.

The stress-bias required for the fully implantable hearing aid system's transducer can be simply obtained through differential thermal expansion of materials deliberately created during the fabrication of the unimorph. Since in general for the same temperature change metals expand more than ceramic dielectric materials, a ceramic layer may be easily subjected to compressive stresses similar to those in Aura Ceramics' Rainbow products. However, the bond between the metal and the ceramic dielectric should be as thin and strong as possible.

The transducers required for the fully implantable hearing aid system are fairly thin. The desired overall transducer thickness ranges from 1.0 to 6.0 mils, providing a compromise between good deflection (for thin transducers) and ease of fabrication and ruggedness with thick transducers. Consequently, it is possible to produce suitable stress-biased structures by vacuum deposition such as sputtering, evaporating or spraying metal onto a hot piezoelectric substrate, thereby producing a suitable metal phase. Upon cooling, greater contraction of the metal layer in comparison with the piezoelectric layer creates the required stress-bias. In principal, such a process yields a type of stress-bias similar to that produced by reduction and fabrication of Aura Ceramics' Rainbow products.

It is believed that metals with physical properties similar to those of the Rainbow material's conductive Crete layer 22b will yield near optimum performance for the fully implantable hearing aid system's transducer. The thermal expansion of most piezoelectric materials is about 2–4 ppm/° C., while the Crete expansion coefficient is about 10 ppm/° C. Hence it is desirable to find biocompatible metals which have an expansion coefficient similar to that of the conductive Crete layer 22b, and that have suitable mechanical strength. Materials having such characteristics include Nitinol, titanium, platinum, rhodium, palladium, gold, and nickel, if suitably prepared. The first two materials, i.e. Nitinol and titanium, have excellent biocompatible properties. Both the thermal expansion coefficient (11 ppm/° C.) and the elastic modulus ($8 \times 10^{11}$ Pa) of the austenitic phase of Nitinol match closely the corresponding properties of the conductive Crete layer 22b of Aura Ceramics' Rainbow products (respectively 10 ppm/° C. and $7 \times 10^{11}$ Pa). Therefore, for the same thickness of the conductive layers 22b and 36, and for the dielectric layers 22a and 34, it is reasonable to expect that the same stress-bias will develop upon cooling since the difference between the transducers' processing temperature and operating temperature are approximately the same.

FIG. 3 depicts a thermal expansion diagram for Nitinol. Upon cooling from high temperature along a line 52 in FIG. 3 to a temperature T1, Nitinol exhibits a contraction coefficient of 11 ppm/° C. Along the line 52 of the phase diagram, Nitinol exists as a harder austenitic phase. Upon reaching the temperature T1 (around 80° C.), a phase change commences that converts Nitinol's hard austenitic phase material to a softer martensitic phase. Conversion to the martensitic phase during cooling of Nitinol from the temperature T1 to a temperature T2 along a line 54 causes Nitinol to expand significantly, i.e. up to 0.5% of its length. Linear expansion during Nitinol's phase transformation from the austenitic phase to the martensitic form may be as much as 2000 ppm, equivalent to expansion of the material over almost 200° C. if the phase change did not occur. At T2 (around 75° C.), Nitinol completes its conversion to the martensite phase. Further cooling of Nitinol below T2 along a line 56 in FIG. 3, Nitinol exhibits the martensitic contraction (expansion) coefficient of 6 ppm/° C. Nitinol's martensitic phase has an elastic modulus which is 2 to 3 times lower than the austenitic elastic modulus, and the martensitic phase's yield strength is from 3 to 5 times less than the austenitic phase.

Heating Nitinol along the line 56 from below the martensitic transition temperature T2 produces an expansion of the material up to a temperature T3 (about 90° C.). Further heating of the material above the temperature T3 along a line 58 commences conversion of Nitinol's softer martensitic phase material to the harder austenitic phase. Conversion to the austenitic phase during heating of Nitinol from the temperature T3 to a temperature T4 along a line 58 causes, Nitinol to contract significantly, i.e. up to 0.5% of its length. At T4 (around 95° C.), Nitinol completes its conversion to the austenitic phase. The temperature hysteresis in Nitinol's phase change cycle is approximately of 10–20° C., but can be larger.

Because Nitinol's martensitic phase is much softer than the material's austenitic phase, use of the material in the martensitic phase to apply a pre-established stress-bias to the plate 34 depicted in FIG. 2 requires a substantially thicker layer 36 of Nitinol than if the material is in the austenitic phase. Use of a thick Nitinol layer 36 is more expensive, and is undesirable for various other reasons. Also, if stress-bias is applied to the plate 34 by thermal expansion, a significant portion of the desired stresses will be released if Nitinol undergoes the phase transition to the martensitic form.

Consequently, using a shape memory allow which has a phase change temperature well below the operating temperature of the transducer, i.e. 36° C., or, in general, room temperature, is preferable for a transducer to be included in the fully implantable hearing aid system. In the bulk material, lowering the martensitic phase transition temperature T1 of Nitinol may be accomplished by adding small percentages of copper, iron, cobalt or chromium to the nickel-titanium alloy. However, for the fully implantable hearing aid system's transducer, the layer 36 is often applied from the vapor phase, as it is difficult to find nickel-titanium alloy foils having the required thickness. (However, it appears that foils having the requisite thickness may be obtained on special order from Shape Memory Applications, Inc. of Santa Clara, Calif.)

The martensitic phase transition temperature T1 of sputtered nickel-titanium films is typically approximately 60–80° C., which is too high for the fully implantable hearing aid system's transducer. It has been observed that adding impurities inadvertently (as for example contaminants present on the surface of a poorly cleaned sample) may lower the martensitic phase transition temperature T1 significantly, without greatly affecting Nitinol's mechanical properties. Alternatively, it has been observed that co-sputtering nickel-titanium together with metallic impurities, such as copper, iron, cobalt or chromium, typically with all constituent elements mixed in the sputtering target, may produce a martensitic phase transition temperature T1 well below room temperature. Furthermore, in many sputtering systems it has also been observed that depositing the nickel-titanium layer 36 with a large anode-cathode separation produce a lower martensitic phase transition temperature T1.

In practice then, Nitinol material suitable for the transducer used in the fully implantable hearing aid system may be prepared as follows. First, the nickel-titanium alloy including the copper, iron, cobalt or chromium impurity is sputtered from the target unto the plate 34, which may be at moderate temperature (e.g. 100–200° C.). Typically the sputtered Nitinol material will be amorphous. The laminated unimorph 32 is then heated in an inert atmosphere or vacuum to 500° C. for approximately one-half (0.5) hour to form the desired high strength austenitic phase. Heating the laminated unimorph 32 to 500° C. also removes all stresses, and sets the temperature range over which the material will be stressed by differential thermal contraction. Alternatively, the nickel-titanium alloy including the copper, iron, cobalt or chromium impurity may be deposited directly on the plate 34 at high temperature. A typical sputtering rate may be 6 minutes per micron of the Nitinol layer 36, with 2 kW of power, at a pressure of $2 \times 10^{-3}$ micron of argon. The austenitic phase is preserved during cooling to room temperature. For Nitinol in the austenitic phase, the optimum thickness for the layer 36 is about 35 microns for a 75 microns thick plate 34, i.e. about 0.5. For a 50 micron thick PLZT plate 34, the optimum thickness for the Nitinol layer 36 is about 23 microns.

As an alternative to Nitinol, sputtered films of either pure nickel or pure titanium that are annealed at 500° C. and cooled can also be used very advantageously for the fully implantable hearing aid system's transducer, although nickel is not quite as biologically inert as titanium. Nickel's large coefficient of expansion (13 ppm/° C.) permits a thinner layer 36 to produce the desired compression of the ceramic laminated unimorph 32. Titanium's coefficient of expansion (9 ppm/° C.) closely matches that of the conductive Crete layer 22b. The coefficients of expansion of other metals such as platinum, rhodium, palladium, or gold are also similar to that of the conductive Crete layer 22b.

For nickel, the optimum thickness of the layer 36 is approximately 0.26 of the thickness of the plate 34, and the bowing of the laminated unimorph 32 is about 20% larger at the same voltage than with Nitinol. For titanium, the optimum thickness of the layer 36 is about 0.40 of the thickness of the plate 34, and the bowing of the laminated unimorph 32 is about 10% greater at the same voltage than for Nitinol. As compared to the PLZT transducer 22, the optimum nickel structure provides up to a 30% improvement for the same thickness of the ceramic plate 34 and the same applied voltage.

The temperature difference, from the annealing temperature to room temperature, over which the differential contraction occurs together with the difference in the coefficients of thermal expansion between the plate 34 and the layer 36 applies a stress-bias to the laminated unimorph 32. Moreover, because the layer 36 may be applied incrementally, it is therefore possible to establish a particular stress-bias for the laminated unimorph 32 using the method described above, and to then subsequently increase the thickness of the layer 36 at a lower temperature, without significantly changing the existing stress-bias. The ability to establish a particular stress-bias in the piezoelectric plate 34 independently of the total thickness of the layer 36 permits establishing a thickness for the layer 36 which produces optimum deflection of the laminated unimorph 32 in response to a voltage applied across the layer 36 and the electrode 44. Such tailoring of the conductive Crete layer 22b is impossible for the Aura Ceramics' Rainbow products.

FIG. 4 depicts a stress-biased laminated unimorph 62 in accordance with the present invention. The laminated unimorph 62 typically includes a 75 micron (3 mils) thick piezoelectric plate 64 preferably of a biocompatible ceramic PZT or PLZT material. Using titanium for the stress-biasing material, the optimum thickness for the metal layer 66–68 is 30 microns, although a 20 micron thickness produces 95% the deflection of a 30 micron thick layer 66–68. Thus, for example, a 10 micron thick metallic layer 66 of titanium (or any suitable thickness to provide the desired stress-bias) is first sputtered onto the laminated unimorph 62, annealed at 500° C. as described above, and then cooled. Subsequently, another metallic layer 68, e.g. 10 microns or any other appropriate thickness of titanium or any other suitable metal, can then be sputtered or bonded onto the layer 66 without annealing to increase the total thickness of the metal layers 66 and 68 to that which provides optimum deformation characteristics for the laminated unimorph 62. The deposition or bonding of the layer 68 does not significantly change the stress-bias applied by the layer 66, although insignificant stresses may sometimes result from the deposition of the layer 68. A thin, biocompatible metal electrode 72 is applied to the plate 64 opposite the layers 66 and 68.

The layers 66 and 68 of FIG. 4 may be of different materials, if so desired. For example the first layer 66 may be titanium, providing excellent adhesion to the plate 64, while the second layer 68 may be nickel which sticks well to titanium. Vice versa, the first layer 66 may be nickel to create a particular stress-bias with a relatively thin layer of metal. The nickel layer 66 may then be subsequently coated with titanium to improve the biocompatibility of the laminated unimorph 62. Typically, the laminated unimorph 62 has a total thickness from 1.0 to 6.0 mils, with the combined thickness of the layers 66 and 68 equaling from 0.5 to 0.15 the thickness of the plate 64. Since it is difficult to cut a bowed material, often it is desirable to shape the plate 64 to its desired size as a flat sheet, and then deposit the metal layers 66 and 68. Note that nickel can be readily plated in various forms (e.g. electrolytic or electroless), to the required thickness. Very thin layers of chromium (a few hundred Angstroms) can be applied to the plate 64 if necessary to improve adhesion before depositing the layer 66.

Other materials which may be used for the transducer of the fully implantable hearing aid consist of a PLZT or PZT plate that is physically bonded to a metal sheet at high temperature. Here both a ceramic plate and a metal sheet are heated to the same high temperature, with a solder or other suitable bonding material disposed between the ceramic plate and the metal sheet. Upon cooling, the unimorph thus created exhibits the desired stress-bias. The biocompatible material used for the metal sheet include titanium, nickel, platinum, rhodium, palladium, gold, or Nitinol foils, about 0.5 to 3.5 mils thick, in the same metal/ceramic thickness ratio as described above. To avoid possible leaching of the metallic form of lead, suitable bonding materials include various types of lead free solder, for example indium alloys particularly in paste form. Such solder pastes may be screen printed unto the metal sheet or the piezoelectric ceramic plate in very thin layers e.g. 5 microns thick. The metal sheet thickness is about 0.5 to 0.15 of the thickness of the piezoelectric ceramic plate. Suitable bonding temperatures are 150–400° C. Typically a weight is put on the stacked ceramic plate and metal sheet to press them together during bonding. The weight may be removed during cooling. Usually the piezoelectric ceramic plate will first be coated with a very thin layer of silver paste that is then fired onto the piezoelectric ceramic at high temperature. An electrically conductive metal electrode on the ceramic side, opposite the bonded metal sheet, should be as thin as possible, to avoid creating stresses which oppose the stresses generated by the bonded metal sheet. These stress-biased structures, 1.25 inch in diameter, 15 mils thick produce axial displacements of 100 micron in response to an applied signal of 150 volts. Hence for a 4 mil thick structure, 2.5 mm in diameter, with 10 V drive, the expected axial transducer displacement is about 0.6 micron, more than adequate for the transducer included in the microactuator of the fully implantable hearing aid system.

FIG. 5 depicts generally deflection sensitivity of a laminated unimorph, such as the unimorphs 32 and 62, as a function of the thickness of the metal layer 36 or 66–68. A graph 76, indicated by "+" symbols, in FIG. 5 depicts deflection sensitivity versus thickness of the metal layer 36 or 66–68 for a 2.0 mm square or disk-shaped plate 34 or 64 of 3203 PZT ceramic piezoelectric material that is 75.0 microns thick computed using a formula by Timoshenko for bimetallic springs, Journal Optical Society of America, vol. 11, no. 233, 1925. A line graph 78 in FIG. 5 depicts deflection sensitivity versus thickness of the metal layer 36 or 66–68 for the same piezoelectric material computed using a formula by Chu et al., J. Micromech. Microeng. 3 (1993), also for bimetallic springs. As depicted by the graphs 76 and 78, increasing the thickness of the metal layer 36 or 66–68 initially increases the deflection sensitivity of the unimorph 32 or 62. Moreover, the deflection sensitivity of the unimorph 32 or 62 continues to increase with increasing thickness of the metal layer 36 or 66–68 until reaching a maximum value that extends across a broad range of thicknesses.

Heating the laminated unimorph 32 or 62 to 500° C. exceeds the Curie point of the piezoelectric ceramic material. Therefore the piezoelectric ceramic material needs to be repoled preferably as the laminated unimorph 32 or 62 cools. Alternatively the laminated unimorph 32 or 62 can be repoled after cooling. PZT materials suitable for the laminated unimorph 32 or 62 are identified by various commercial names such as PZT-4, PZT-5A, PZT-5H, PZT-8, C3100, and C3200, and in particular 3203, 3199 or 3211, the latter materials being manufactured by Motorola, Inc. Desirable properties for the laminated unimorph 32 or 62 include a very high value for the piezoelectric constant d31, which determines transverse contraction, and for good mechanical machinability. The 3203 material appears best in these respects, and is the presently preferred material.

FIGS. 6A and 6B depict a microactuator 82 adapted for inclusion in a fully implantable hearing aid system. The microactuator 82 includes a hollow body 84, depicted only in FIG. 6B, from one end of which projects an L-shaped, flanged nozzle 86. The flanged nozzle 86 has an open first end 88 that is sealed by a flexible diaphragm 92 that may be deflected outward from and inward toward the flanged nozzle 86. As described in greater detail in the 02323 PCT Patent Application, the first end 88 and the diaphragm 92 are adapted for implantation into a fenestration formed through a promontory that is located between a subject's middle and inner ear. The body 84 has two open faces 94a and 94b that are separated from the first end 88. Each of the faces 94a and 94b are respectively sealed by flexible diaphragms 96a and 96b which, in combination with the diaphragm 92, hermetically seal the body 84. As depicted in FIG. 6B, the diaphragms 96a and 96b respectively have cross-sectional areas that are larger than a cross-sectional area of the diaphragm 92. While the preceding description of the body 84 identifies various individual parts thereof, the body 84 may, in fact, be provided by a one-piece can formed from a material suitable for the diaphragms 96a and 96b.

The hermetically sealed hollow body 84 is filled with the incompressible liquid 98. Respectively secured to each of the diaphragms 96a and 96b are transducers 102 which face each other. In accordance with the present invention, the transducers 102 of the microactuator 82 are provided by the laminated unimorphs 32 or 62. Each of the transducers 102 are electrically connected to a miniature cable 104 to expand or contract in opposite direction toward or away from each other in response to the same voltage applied across each of the transducers 102. This driving motion of the transducers 102 applied to the diaphragms 96a and 96b forces the liquid 98 toward or away from the diaphragm 92 that is located in a subject's inner ear thereby deflecting the diaphragm 92. While the microactuator 82 preferably employs a pair of transducers 102, a microactuator 82 in accordance with the present invention may have only a single transducer 102, or each transducer 102 of the pair may have a different shape and/or size.

As described in greater detail above, the transducer 102 exhibits maximum deflection sensitivity when the combined thicknesses of the metal layer 36 or 66–68 together with that of the diaphragm 96a or 96b is within the broad range of optimum thickness computed using the theories of Timoshenko and/or Chu. Thus, the laminated unimorph 62 may be built by first depositing the layer 66, and by then bonding the layer 66 to the diaphragm 96a or 96b which therefore provides the second layer 68. One method for assembling the laminated unimorph 62 is by first bonding the layer 66 to the diaphragm 96a or 96b, which is then secured to the remainder of the body 84 by electron-beam or laser welding. Alternatively, the diaphragm 96a or 96b may first be welded onto the remainder of the body 84, after which the layer 66 is bonded to the diaphragm 96a or 96b.

An alternative stress-biased unimorph which may be used for the transducer 102 is a NASA Langley Research Center's THin-layer composite UNimorph ferroelectric DrivER and sensor ("THUNDER") high-displacement actuator. As described in NASA publications, the THUNDER transducer consists of a piezoelectric plate intimately attached to a pre-stressing layer with LARC-SI, a NASA Langley Research Center developed polyimide adhesive. Reportedly, the pre-stressing layer, provided by adhesive backed foils, is thermally bonded together and to the piezoelectric plate in vacuum. This initial vacuum and thermal processing yields a partially pre-stressed THUNDER unimorph. Fabrication of the THUNDER unimorph is then completed by pressing the partially pre-stressed unimorph onto a curved fixture while heating it to increase the unimorph's pre-stress.

To isolate the transducers 102 from a subject's body, the body 84 and the transducers 102 of the microactuator 82 are preferably enclosed within a hermetically sealed titanium housing 112. As illustrated in FIG. 6B the housing 112 is joined to the flanged nozzle 86 around a perimeter of a flange 114 such as by electronbeam or laser welding. Alternatively, the body 84 and the transducers 102 may be enclosed with a with parylene coating thereby isolating them from a subject's body.

Anatomical considerations permit the transducers 102 to extend a considerable distance into a subject's middle ear cavity, and also permit shapes for the body 84 and the transducers 102 that differ from those depicted in FIGS. 6A and 6B. The base of the body 84 adjacent to the flanged nozzle 86 can be very narrow and the length of the body 84 and transducers 102 extending outward from the flanged nozzle 86 enlarged so that the volume of the liquid 98 displaced by the transducers 102 becomes quite large. In this way, the faces 94a and 94b and the transducers 102 can be shaped, twisted and tilted to fit a subject's middle ear cavity, and are not restricted to the space available locally at the implantation site.

While the illustrations of FIGS. 6A and 6B depict the diaphragms 96a and 96b as being oriented parallel to the diaphragm 92 with the diaphragms 96a and 96b parallel to each other, other orientations of the diaphragms 96a and 96b with the respect to the diaphragm 92 are within the scope of the present invention. Accordingly, the diaphragms 96a and 96b can be oriented at a skewed angle with respect to the flanged nozzle 86 and diaphragm 92 to prevent the transducers 102 from interfering with an ossicular chain 21 or other structures located within a subject's middle ear. The flanged nozzle 86 provides good anchoring to the promontory without requiring extra room which would otherwise reduce space available for the transducers 102.

Although the present invention has been described in terms of the presently preferred embodiment, it is to be understood that such disclosure is purely illustrative and is not to be interpreted as limiting. While it appears that stress-biased transducers 102 offer superior performance for the microactuator 82, it also appears that transducers 102 that are not stress-biased offer performance adequate for the fully implantable hearing aid system. Consequently, without departing from the spirit and scope of the invention, various alterations, modifications, and/or alternative applications of the invention will, no doubt, be suggested to those skilled in the art after having read the preceding disclosure. Accordingly, it is intended that the following claims be interpreted as encompassing all alterations, modifications, or alternative applications as fall within the true spirit and scope of the invention.

What is claimed is:

1. A biocompatible unimorph adapted for use as a transducer of a microactuator included in a fully implantable hearing aid system, the unimorph comprising:

a plate of biocompatible piezoelectric material;

a layer of biocompatible metal deposited onto said plate of biocompatible piezoelectric material; and a thin, biocompatible electrode applied to said plate of biocompatible piezoelectric material opposite said layer of biocompatible metal, whereby application of an electric potential across said layer of biocompatible metal and said biocompatible electrode causes the unimorph to deflect.

2. The biocompatible unimorph of claim 1 wherein said plate of biocompatible piezoelectric material is formed from lead zirconia titanate ("PZT") material.

3. The biocompatible unimorph of claim 1 wherein said plate of biocompatible piezoelectric material is formed from lead lanthanum zirconia titanate ("PLZT") material.

4. The biocompatible unimorph of claim 1 wherein said layer of biocompatible metal is formed from a material chosen from a group consisting of titanium, platinum, rhodium, palladium, gold, and nickel.

5. The biocompatible unimorph of claim 1 herein said layer of biocompatible metal is formed from a shape memory material.

6. The biocompatible unimorph of claim 5 wherein the shape memory material forming said layer of biocompatible metal is a nickel-titanium Naval Ordinance Laboratory ("Nitinol") alloy.

7. The biocompatible unimorph of claim 1 wherein:

said layer of biocompatible metal is deposited onto said plate of biocompatible piezoelectric material; and wherein, after depositing said layer of biocompatible metal onto said plate of biocompatible piezoelectric material, the unimorph is:

heated to a temperature which relieves stress in the unimorph; and cooled whereby said layer of biocompatible metal applies a stress-bias to said plate of biocompatible piezoelectric material.

8. The biocompatible unimorph of claim 7 wherein the material forming said layer of biocompatible metal is chosen from a group consisting of titanium, nickel, platinum, rhodium, palladium, gold, and Nitinol; and wherein following depositing the unimorph is heated to approximately 500° C.

9. The biocompatible unimorph of claim 1 wherein:

said layer of biocompatible metal is deposited onto said plate of biocompatible piezoelectric material that is heated to a temperature which relieves stress in the unimorph, material that forms said layer of biocompatible metal; and wherein, after depositing said layer of biocompatible metal onto said heated plate of biocompatible piezoelectric material, the unimorph is:

cooled whereby said layer of biocompatible metal applies a stress-bias to said plate of biocompatible piezoelectric material.

10. The biocompatible unimorph of claim 9 wherein during depositing said plate of biocompatible piezoelectric material is heated to approximately 500° C., and wherein the material forming said layer of biocompatible metal is chosen from a group consisting of titanium, nickel, platinum, rhodium, palladium, gold, and Nitinol.

11. The biocompatible unimorph of claim 1 wherein said plate of biocompatible piezoelectric material has a thickness, and said layer of biocompatible metal has a thickness that is between 0.15 and 0.5 times the thickness of said plate.

12. The biocompatible unimorph of claim 1 wherein:

a fraction of said layer of biocompatible metal is first deposited onto said plate of biocompatible piezoelectric material;

the unimorph is cooled whereby said layer of biocompatible metal then deposited onto said plate of biocompatible piezoelectric material applies a stress-bias to said plate; and additional material for forming said layer of biocompatible metal is bonded to said existing layer of biocompatible metal to complete formation of said layer of biocompatible metal.

13. The biocompatible unimorph of claim 12 wherein said layer of biocompatible metal first deposited onto said plate of biocompatible piezoelectric material together with the additional material for forming said layer of biocompatible metal bonded to said existing layer of biocompatible metal have a combined thickness which provides optimum deflection sensitivity for the unimorph.

* * * * *